(12) United States Patent
Chiang et al.

(10) Patent No.: US 10,276,510 B2
(45) Date of Patent: Apr. 30, 2019

(54) MANUFACTURING METHOD OF PACKAGE STRUCTURE HAVING CONDUCTIVE SHIELD

(71) Applicant: Powertech Technology Inc., Hsinchu County (TW)

(72) Inventors: Chia-Wei Chiang, Hsinchu County (TW); Li-Chih Fang, Hsinchu County (TW); Ji-Cheng Lin, Hsinchu County (TW); Che-Min Chu, Hsinchu County (TW); Chun-Te Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 2 days.

(21) Appl. No.: 15/713,717

(22) Filed: Sep. 25, 2017

(65) Prior Publication Data

US 2019/0096821 A1    Mar. 28, 2019

(51) Int. Cl.
| | |
|---|---|
| *H01L 21/56* | (2006.01) |
| *H01L 23/552* | (2006.01) |
| *H01L 23/00* | (2006.01) |

(52) U.S. Cl.
CPC .......... *H01L 23/552* (2013.01); *H01L 21/561* (2013.01); *H01L 24/03* (2013.01); *H01L 24/97* (2013.01); *H01L 2224/0231* (2013.01); *H01L 2224/0401* (2013.01); *H01L 2224/05111* (2013.01); *H01L 2224/05124* (2013.01); *H01L 2224/05144* (2013.01); *H01L 2224/05147* (2013.01); *H01L 2224/05155* (2013.01); *H01L 2224/09515* (2013.01);

(Continued)

(58) Field of Classification Search
CPC .............. H01L 23/552; H01L 24/03; H01L 2224/02381; H01L 2224/0231; H01L 2924/3025
See application file for complete search history.

(56) References Cited

U.S. PATENT DOCUMENTS

| | | | |
|---|---|---|---|
| 9,111,945 B2 | 8/2015 | Tsai et al. | |
| 2001/0020737 A1* | 9/2001 | Kwon | .......... H01L 23/3114 257/678 |

(Continued)

FOREIGN PATENT DOCUMENTS

| | | |
|---|---|---|
| CN | 104733332 | 6/2015 |
| TW | 201214653 | 4/2012 |

*Primary Examiner* — Laura M Menz
*Assistant Examiner* — Candice Chan
(74) *Attorney, Agent, or Firm* — JCIPRNET

(57) ABSTRACT

A manufacturing method of a package structure including the following steps is provided. A plurality of first conductive connectors and a second conductive connector on an active surface of a die are formed. The first conductive connectors are electrically connected to the die. The second conductive connector is formed aside the first conductive connectors and electrically insulated to the die. A redistribution layer is formed on the die. The redistribution layer is electrically connected to the first conductive connectors and the second conductive connector. A conductive shield is formed on the redistribution layer to surround the second conductive connector and at least a portion of a sidewall of the die coupled the active surface. The die is electrically insulated from the conductive shield. Another manufacturing method of a package structure is also provided.

20 Claims, 10 Drawing Sheets

(52) U.S. Cl.
CPC .............. *H01L 2924/0105* (2013.01); *H01L 2924/01013* (2013.01); *H01L 2924/01028* (2013.01); *H01L 2924/01029* (2013.01); *H01L 2924/01079* (2013.01); *H01L 2924/3025* (2013.01)

(56) References Cited

U.S. PATENT DOCUMENTS

2004/0108595 A1* 6/2004 Shen .................. H01L 23/3114
 257/737
2011/0298101 A1* 12/2011 Pagaila ................ H01L 21/561
 257/659

* cited by examiner

MANUFACTURING METHOD OF PACKAGE STRUCTURE HAVING CONDUCTIVE SHIELD

BACKGROUND OF THE INVENTION

Field of Invention

The present disclosure relates to a manufacturing method of a package structure, and more particularly, to a manufacturing method of a package structure having electromagnetic interference (EMI) shielding.

Description of Related Art

Semiconductor package technology has been progressed in recent years in order to develop products with smaller volume, lighter weight and higher operation speed. However, electromagnetic interference (EMI) may negatively affect the operation of semiconductor packages and heat may reduce the efficiency or even damage semiconductor packages. As such, as operation speed increases and package size decreases, conventional packaging techniques are severely challenged in providing an improved semiconductor package with EMI shielding and thermal dissipation.

SUMMARY OF THE INVENTION

The disclosure provides a manufacturing method of a package structure, which provides a reliable structure with effective control of electromagnetic interference (EMI).

The disclosure provides a manufacturing method of a package structure. The method includes the following steps. A plurality of first conductive connectors and a second conductive connector on an active surface of a die are formed. The first conductive connectors are electrically connected to the die. The second conductive connector is formed aside the first conductive connectors and is electrically insulated from the die. A redistribution layer is formed on the die. The redistribution layer is electrically connected to the first conductive connectors and the second conductive connector. A conductive shield is formed on the redistribution layer to surround the second conductive connector and at least a portion of a sidewall of the die coupled the active surface. The die is electrically insulated from the conductive shield.

The disclosure provides a manufacturing method of a package structure. The method includes the following steps. A wafer is provided. The wafer includes a plurality of first regions and a plurality of second regions. Each of the second regions is connected to one of the first regions, respectively. The second regions are electrically insulated. A plurality of conductive connectors is disposed on the first regions and the second regions of the wafer. A redistribution layer is formed on the conductive connectors to electrically connect the conductive connectors. A portion of the wafer is removed to form a plurality of dies. Each of the dies includes one of the first regions and one of the second regions. The dies are electrically connected to the redistribution layer through the conductive connectors corresponding to the first regions. A conductive shield is formed on the redistribution layer to cover the dies. The conductive shield is electrically insulated from the dies. A singulation process is performed to form a package structure.

Based on the above, since the conductive shield is connected to the redistribution layer and surrounds the die, it may provide the EMI shielding function in the package structure and the chip structure. As such, the package structure and the chip structure may achieve the enhanced EMI shielding effectiveness and thermal dissipation without impacting reliability of the structure.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1A:
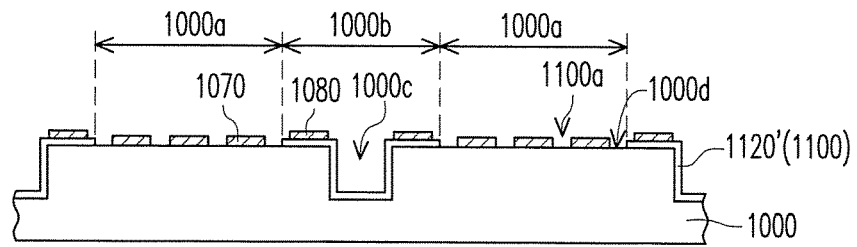
FIG. 1A to FIG. 1G are schematic cross-sectional views illustrating a manufacturing method of a package structure according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1A to FIG. 1G are schematic cross-sectional views illustrating a manufacturing method of a package structure according to a first embodiment of the disclosure. Referring to FIG. 1A, a wafer 1000 is provided. The wafer 1000 may include a plurality of first regions 1000a and a plurality of second regions 1000b. Each first region 1000a may be surrounded by one second region 1000b. In some embodiments, a plurality of slots 1000c may be formed on the second regions 1000b of the wafer 1000 from an active surface 1000d of the wafer 1000. The plurality of slots 1000c can be formed using a half-cut dicing process, an etching process, or other suitable process. For example, the slots 1000c may be disposed at the two opposite sides of each die or surround each die such that the slots 1000c may be conducive to separate the wafer 1000 into individual dies in the subsequent processes.

In some embodiments, the second regions 1000b of the wafer 1000 may be electrically insulated. For example, an insulating material (not illustrated) may be conformally formed on the active surface 1000d and the inner surface of the slot 1000c using a deposition process (e.g. a coating process, a physical vapor deposition process, a chemical vapor deposition process or the like), or other suitable process. The insulating material may include epoxy resin, inorganic materials (e.g. silicon oxide, silicon nitride, or the like), organic polymer materials (e.g. polyimide, polybenzoxazole, or the like), photoresist materials, or other suitable insulating material. Subsequently, the insulating material may be patterned to form a patterned passivation 1120' of a passivation layer 1100. For example, a portion of the insulating material may be removed by lithography and etching processes, or other suitable processes to form a plurality of openings 1100a. In some embodiments, the patterned passivation 1120' may cover the second regions 1000b and expose the first regions 1000a through the openings 1100a.

In some other embodiments, a plurality of first pads 1070 and a plurality of second pads 1080 may be formed on the active surface 1000d of the wafer 1000 using a plating process, or other suitable process. For example, the first pads 1070 may be formed in the openings 1100a corresponding to the first regions 1000a. In some embodiments, the first pads 1070 may be referred as bump pads for transmitting electrical signals or power according to the circuit design. The second pads 1080 may be formed on the patterned passivation 1120' on the peripheral area of the second regions 1000b and away from the slots 1000c. In some embodiments, the second pads 1080 may be referred as ground pads. Materials of the first pads 1070 and the second pads 1080 may include copper, aluminium, tin, gold, nickel, or other suitable conductive materials.

Figure 1B:
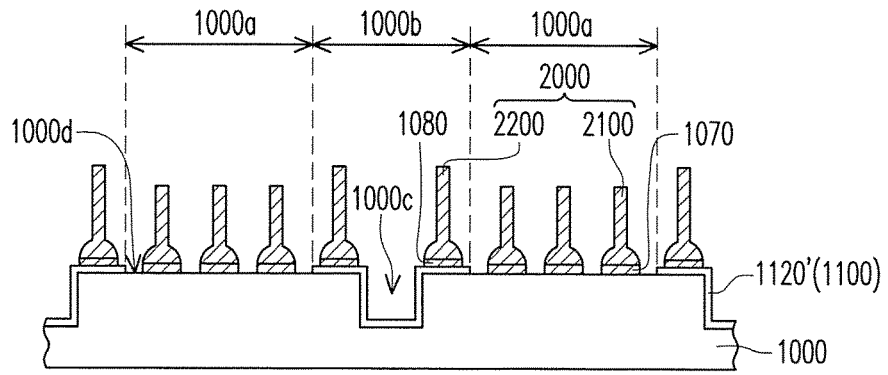

Referring to FIG. 1B, a plurality of conductive connectors 2000 may be disposed on the active surface 1000d of the wafer 1000. The plurality of conductive connectors 2000 may be formed using a wire bonding, a plating process or other suitable process. For example, the conductive connectors 2000 may include a plurality of first conductive connectors 2100 formed on the first pads 1070 and a plurality of second conductive connectors 2200 formed on the second pads 1080. In other word, the wafer 1000 may be electrically insulated from the second conductive connectors 2200 through the patterned passivation 1120'. In some embodiments, the conductive connectors 2000 may be conductive stud bumps (e.g. copper stud bumps, gold stud bumps, or the like) or conductive pillars (e.g. copper pillars, gold pillars, or the like) or the combinations thereof. Other possible shapes and forms of the conductive connectors 2000 may be utilized, which construe no limitation in the disclosure. In some other embodiments, the first conductive connectors 2100 and the corresponding first pads 1070 may be formed in the same process and/or with the same material. Similarly, the second conductive connectors 2200 and the corresponding second pads 1080 may be formed in the same process and/or with the same material.

Figure 1C:
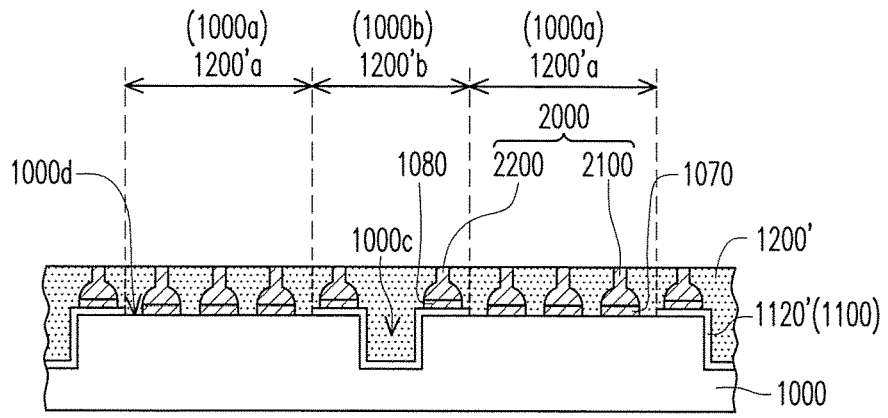

Referring to FIG. 1C, a photosensitive material 1200' such as photoresist materials containing epoxy resin may be formed on the active surface 1000d of the wafer 1000. The photoresist materials are formed using a deposition process (e.g. a coating process, a physical vapor deposition process, a chemical vapor deposition process), or other suitable process. The photosensitive material 1200' may include a central portion 1200'a disposed on the first regions 1000a and a peripheral portion 1200'b coupled to the central portion 1200'a and disposed on the second regions 1000b. In some embodiments, the central portion 1200'a may encapsulate the first conductive connectors 2100 and the peripheral portion 1200'b may encapsulate the second conductive connectors 2200. Subsequently, an exposure process of the photosensitive material 1200' may be performed. For example, a mask (not illustrated) may be utilized during the exposure. It should be noted that the photosensitive material 1200' may include positive tone or negative tone as long as the peripheral portion 1200'b may be removed and the central portion 1200'a may be kept on the active surface 1000d of the wafer 1000 in the subsequent developing process.

In some embodiments, a thinning process (e.g. a grinding process, a polishing process, or other suitable process) may be performed on the active surface 1000d of the wafer 1000 to reduce the thickness of the structure after performing the exposure process. For example, a portion of the conductive connectors 2000 including the first conductive connectors 2100 and the second conductive connectors 2200 may be removed. After performing the thinning process, a top surface (not illustrated) of the first conductive connectors 2100 facing away from the first pads 1070 and a top surface (not illustrated) of the second conductive connectors 2200 facing away from the second pads 1080 may be coplanar. In some other embodiments, a portion of the photosensitive material 1200' may be removed during the thinning process such that a top surface (not illustrated) of the photosensitive material 1200' facing away from the active surface 1000d may be coplanar with the top surface of the first conductive connectors 2100 and the top surface of the second conductive connectors 2200 as shown in FIG. 1C. In some embodiments, after performing the thinning process, the photosensitive material 1200' may expose a portion of the first conductive connectors 2100 and a portion of the second conductive connectors 2200 for further electrical connection. In some other embodiments, the exposure process of the photosensitive materials 1200' may be performed after the thinning process.

Figure 1D:
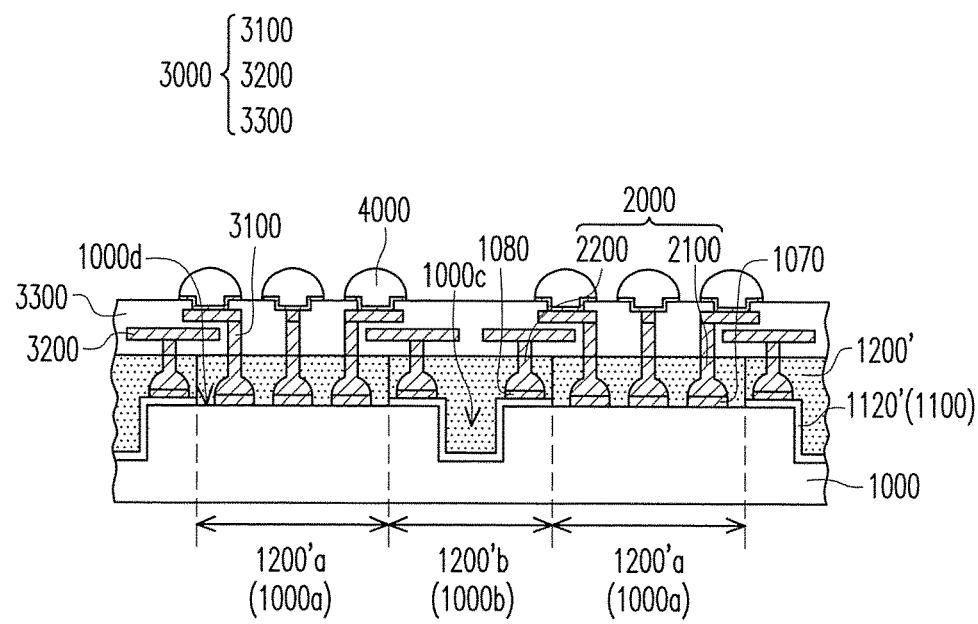

Referring to FIG. 1D, a redistribution layer 3000 may be formed on the photosensitive material 1200' electrically connect to the first conductive connectors 2100 and the second conductive connectors 2200. In other word, the redistribution layer 3000 may be formed on the active surface 1000d of the wafer 1000. The first conductive connectors 2100 electrically connect the wafer 1000 to the redistribution layer 3000. In some embodiments, a signal-transmitting pattern 3100 and a grounding pattern 3200 may be formed during forming the redistribution layer 3000. The signal-transmitting pattern 3100 and the grounding pattern 3200 may be electrically connected to the conductive connectors 2000. In some embodiments, the grounding pattern 3200 may be formed in the periphery of the signal-transmitting pattern 3100.

For example, a patterned conductive layer (not illustrated) may be formed on the top surface of the photosensitive material 1200' through a deposition process, photolithography and etching process, or other suitable processes. In some embodiments, part of the patterned conductive layer electrically connected to the first conductive connectors 2100 may be referred as the signal-transmitting pattern 3100, and another part of the patterned conductive layer electrically connected to the second conductive connectors 2200 may be referred as the grounding pattern 3200. The signal-transmitting pattern 3100 and the grounding pattern 3200 may be formed in the same or different patterned conductive layer. The forming sequences of the signal-transmitting pattern 3100 and the grounding pattern 3200 construe no limitation in the disclosure.

The redistribution layer 3000 may further include a patterned dielectric layer 3300. For example, after forming the signal-transmitting pattern 3100 and/or the grounding pattern 3200, the patterned dielectric layer 3300 may be formed thereon such that the signal-transmitting pattern 3100 and the grounding pattern 3200 may be embedded in the patterned dielectric layer 3300. In some embodiments, the patterned dielectric layer 3300 may be formed before the signal-transmitting pattern 3100 and/or the grounding pattern 3200. In some other embodiments, the abovementioned steps may be performed multiple times to obtain a multi-layered redistribution layer as required by the circuit design. The topmost patterned dielectric layer 3300 may have openings to expose at least the portion of the topmost signal-transmitting pattern 3100 for further electrical connection. In some embodiments, the signal-transmitting pattern 3100 may include under-ball metallurgy (UBM) patterns formed onto the openings of the topmost patterned dielectric layer 3300 for subsequent ball mounting process.

In some embodiments, a plurality of conductive terminals 4000 may be formed on the signal-transmitting pattern 3100 of the redistribution layer 3000 such that the conductive terminals 4000 may electrically connect to the wafer 1000 through the redistribution layer 3000 and the first conductive connectors 2100. For example, the conductive terminals 4000 may include conductive balls, conductive pillars, conductive bumps or a combination thereof. The conductive terminals 4000 may be formed using a ball placement process, a plating process, or other suitable process. Other possible forms and shapes of the conductive terminals 4000 may be utilized according to the design requirement, which construe no limitation in the disclosure. In some embodiments, a soldering process and a reflowing process may be optionally performed to enhance the adhesion between the conductive terminals 4000 and the redistribution layer 3000.

Figure 1E:
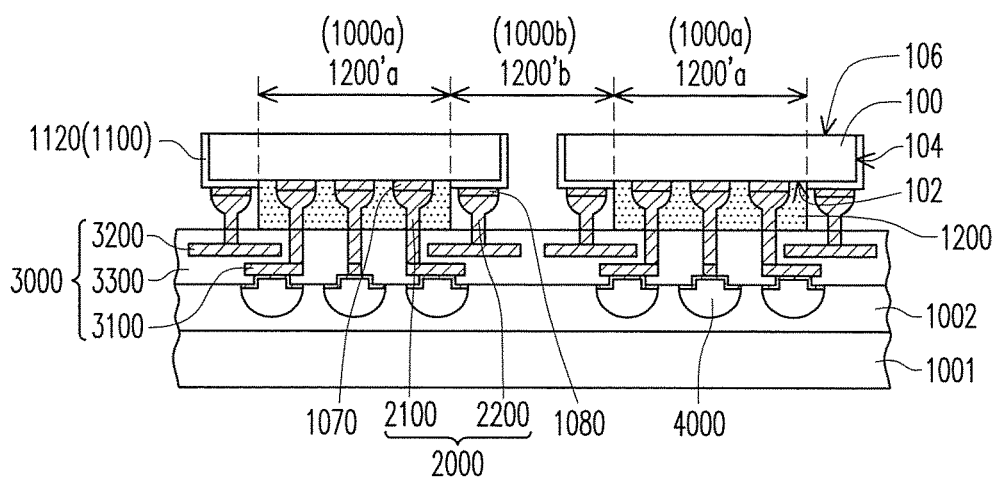

Referring to FIG. 1E, a portion of the wafer 1000 may be removed to form a plurality of dies 100. For example, a grinding process may be performed on a back surface (not illustrated) of the wafer 1000 opposite to the active surface 1000d to remove a portion of the wafer 1000 until the individual dies 100 are formed. Other possible process may be utilized to form the dies 100. In some embodiments, before forming the dies 100, the wafer 1000 may be flipped upside down to dispose on a carrier 1001 for temporary support. A material of the carrier 1001 construe no limitation in the disclosure as long the material is able to withstand the subsequent processes while carrying the package structure formed thereon. In some other embodiments, a de-bonding layer 1002 such as a light to heat conversion (LTHC) release layer or other suitable material may be formed on the carrier 1001 to enhance the releasability between the carrier 1001 and the redistribution layer 3000 in the subsequent process. In some other embodiments, a portion of the patterned passivation 1120' may be removed with a portion of the wafer 1000 during the grinding process. As such, the patterned passivation 1120' may no longer be a continuous layer so as to form a plurality of first portion 1120 of the passivation layer 1100.

In some embodiments, each die 100 may include an active surface 102 which is a part of the active surface 1000d, a sidewall 104 connected to the active surface 102 and a back surface 106 opposite to the active surface 102. The first portion 1120 of the passivation 1100 may cover the side wall 104 and a portion of the active surface 102 where the second conductive connectors 2200 are disposed. The dies 100 may be electrically connected to the redistribution layer 3000 through the first conductive connectors 2100 and electrically insulated from the second conductive connectors 2200 through the first portion 1120 of the passivation layer 1100. The conductive terminals 4000 may be electrically connected to the dies 100 through the redistribution layer 3000 and the first conductive connectors 2100.

Since the grinding process is performed on the back surface of the wafer 1000, at least a portion of peripheral portion 1200'b of the photosensitive material 1200' may be exposed. Subsequently, the peripheral portion 1200'b may be removed using a developing process such that the central portion 1200'a of the photosensitive material 1200' may remain between each die 100 and the redistribution layer 3000. In some embodiments, after the developing process, the central portion 1200'a covering the first conductive connectors 2100 may be referred as a dielectric layer 1200. Since the peripheral portion 1200'b of the photosensitive material 1200' is removed, the second conductive connectors 2200 disposed on the second pads 1080 may be exposed.

Figure 1F:
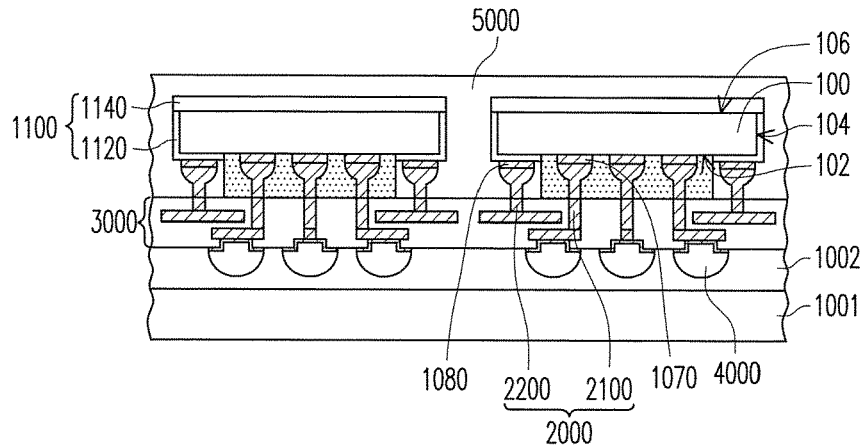

Referring to FIG. 1F, a second portion 1140 of the passivation layer 1100 may be formed to cover the back surface 106 of each die 100 using a lamination process, or other suitable process. The second portion 1140 may be connected to the first portion 1120. A material of the second portion 1140 of the passivation layer 1100 may be the same or similar with the first portion 1120 of the passivation layer 1100. After forming the second portion 1140, each die 100 may be electrically insulated by the passivation layer 1100. In some embodiments, after forming the second portion 1140 of the passivation layer 1100, a conductive shield 5000 may be formed on the redistribution layer 3000 to conformally cover the first portion 1120 and the second portion 1140 of the passivation layer 1100. The conductive shield 5000 may be electrically insulated from the dies 100. In some embodiments, the conductive shield 5000 may cover the second conductive connectors 2200 disposed on the second pads 1080. The conductive shield 5000 is electrically connected to the grounding pattern 3200 of the redistribution layer 3000 through the second conductive connectors 2200 so as to shield the die 100 from electromagnetic interference (EMI). In some other embodiments, the conductive shield 5000 may provide the heat-discharging function and effectively discharge the heat generated from the dies 100. For example, the conductive shield 5000 may include conductive materials (e.g. copper, aluminum, tin, gold, alloy, or the like) formed using an injecting process, a coating process, or other suitable process.

Figure 1G:
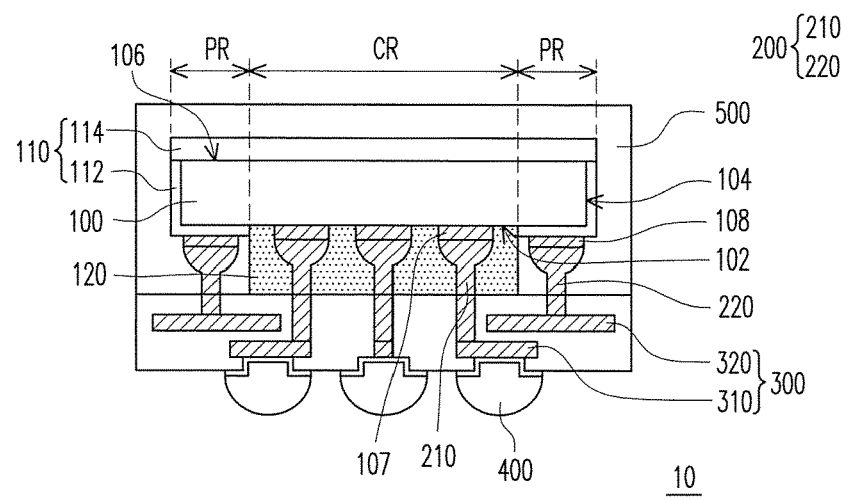

Referring to FIG. 1G, a singulation process (e.g. saw cutting) may be performed and the carrier 1001 may be removed to form a package structure 10. For example, the external energy such as UV laser, visible light or heat, may be applied to the de-bonding layer 1002 so as to remove the carrier 1001. Other suitable removing process of the carrier 1001 may also be utilized. It should be noted that after performing the singulation process, the similar numbers are referred as the singulated elements, for example, the singulated dielectric layer is referred as the dielectric layer 120, the singulated first conductive connectors is referred as the first conductive connectors 210, the singulated redistribution layer is referred as the redistribution layer 300, etc. Other singulated elements follow the same numbering rules and the details thereof are not repeated.

After performing the singulation process, the package structure 10 may include the die 100 having the active surface 102, the first conductive connectors 210 disposed on the active surface 102 and electrically connected to the die 100, the second conductive connectors 220 disposed on the die 100 and surrounding the first conductive connectors 210, the redistribution layer 300 disposed on the die 100, and the conductive shield 500 coupled to the redistribution layer 300 and surrounding the die 100. The second conductive connectors 220 may be electrically insulated from the die 100. The redistribution layer 300 may be electrically connected to the first conductive connectors 210 and the second conductive connectors 220. The die 100 may be electrically insulated from the conductive shield 500.

In some embodiments, the package structure 10 may further include the passivation layer 110 partially covering the peripheral area of the active surface 102 and exposing the central area of the active surface 102, the dielectric layer 120 disposed on the active surface 102 of the die 100 and encapsulating the first conductive connectors 210, and the conductive terminals 400 disposed on a surface of the redistribution layer 300 facing away from the die 100. The die 100 may be electrically insulated from the conductive shield 500 and the second conductive connectors 220 through the passivation layer 110. The die 100 may further include the side wall 104 coupled to the active surface 102 and the back surface 106 opposite to the active surface 102. For example, the passivation layer 110 may include the first portion 112 covering the side wall 104 and a portion of the active surface 102, and a second portion 114 coupled to the first portion 112 and covering the back surface 106 of the die 100. The conductive shield 500 may cover at least a portion of the first portion 112 and the second portion 114 of the passivation layer 110. The conductive terminals 400 may be electrically connected to the die 100 through the redistribution layer 300 and the first conductive connectors 210.

In some embodiments, the redistribution layer 300 may include a signal-transmitting pattern 310 coupled to the first conductive connectors 210 and a grounding pattern 320 coupled to the second conductive connectors 220. For example, the die 100 may include a central region CR and a peripheral region PR surrounding the central region CR. The first conductive connectors 210 may be disposed on the active surface 102 in the central region CR of the die 100. The second conductive connectors 220 surrounding the first conductive connectors 210 may be disposed in peripheral region PR of the die 100. The dielectric layer 120 may be disposed on the central region CR of the die 100. The package structure 10 may further include the conductive shield 500 surrounding the die 100 for providing EMI shielding function and/or the heat-discharging function. In addition, the passivation layer 110 of the package structure 10 including the first portion 112 and the second portion 114 may electrically insulate the die 100 and provide protection. Moreover, having the second conductive connectors 220 disposed in the peripheral region PR and coupled to the grounding pattern 320 while having the first conductive connectors 210 disposed in the central region CR and coupled to the signal-transmitting pattern 310 may simplify the package structure 10, thereby achieving the miniaturization package design.

Figure 2:
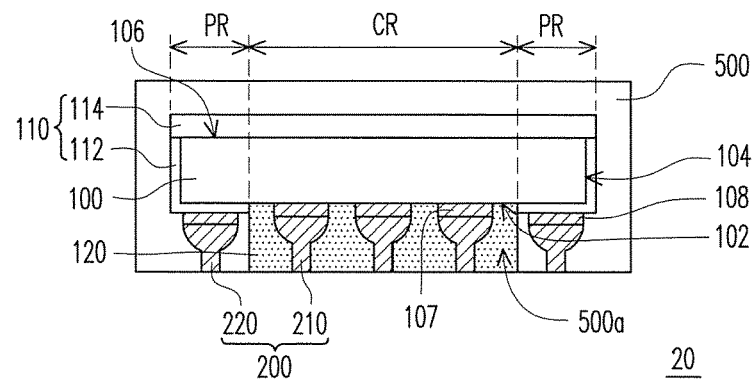
FIG. 2 is schematic cross-sectional views illustrating a chip structure according to an embodiment of the disclosure.

FIG. 2 is schematic cross-sectional views illustrating a chip structure 20 according to an embodiment of the disclosure. Referring to FIG. 2, the manufacturing processes of the chip structure 20 may be similar with the embodiment illustrated in FIG. 1A to FIG. 1G. The chip structure 20 may be compatible with various high-end device applications and advanced front-end technology node which may require the EMI shielding function and/or heat dissipation function.

For example, the chip structure 20 may include the die 100 having the active surface 102, the first pads 107 disposed on the active surface 102, the second pads 108 disposed on the active surface 102 and surrounding the first pads 107, and the conductive connectors 200 disposed on the active surface 102 and electrically connected to the first pads 107 and the second pads 108. The second pads 108 may be electrically insulated from the die 100. The die 100 may be electrically connected to the conductive connectors 200 through the first pads 107.

In some embodiments, the active surface 102 of the die 100 may include the central region CR and the peripheral region PR surrounding to the central region CR. The first pads 107 may be disposed in the central region CR and the second pads 108 may be disposed in the peripheral region PR. In some embodiments, the chip structure 20 may include the passivation layer 110 partially covering the die 100. For example, the passivation layer 110 may be disposed between the second pads 108 and the active surface 102 of the die 100 and disposed between the conductive shield 500 and the sidewall connected to the active surface 102 of the die 100. In some embodiments, the dielectric layer 120 may be disposed on the active surface 102 of the die 100 and cover the first pads 107 and a portion of the conductive connectors 200 connected to the first pads 107. In some other embodiments, the conductive shield 500 having an opening 500a may encapsulate and electrically insulate the die 100. For example, the opening 500a may expose a portion of the active surface 102 where the first pads 107 and a portion of the conductive connectors 200 connected to the first pads 107 are disposed. The dielectric layer 120 may be disposed in the opening 500a. The passivation layer 110 may be disposed between the die 100 and the conductive shield 500 to electrically insulate the die 100 and the conductive shield 500 from each other. The chip structure 20 further includes the conductive shield 500 surrounding the die 100 to provide EMI shielding and/or improve heat-discharging. In addition, the passivation layer 110 covering the die 100 may electrically insulate the die 100 from a portion of the conductive connectors 200 and the conductive shield 500 and may also protect the die 100.

FIG. 3A to FIG. 3E are schematic cross-sectional views illustrating a manufacturing method of a package structure according to an embodiment of the disclosure. It should be noted that a portion of the manufacturing processes may be the same or similar with the processes illustrated in FIG. 1A and FIG. 1B and the detailed descriptions are omitted herein for brevity. In addition, the photosensitive material 1200' may be formed on the wafer 1000 and subsequently exposed using an exposure process. The forming process and the exposure process may be similar with the processes illustrated in FIG. 1C and the detailed description are omitted for brevity.

Figure 3A:
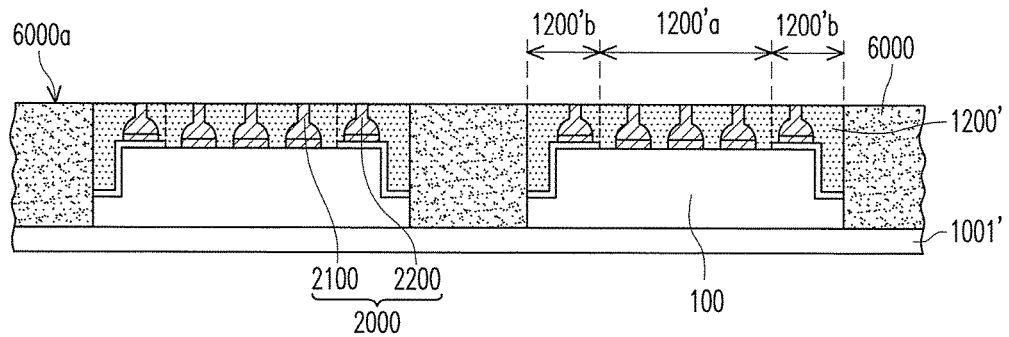
FIG. 3A to FIG. 3E are schematic cross-sectional views illustrating a manufacturing method of a package structure according to an embodiment of the disclosure.

Referring to FIG. 3A, after performing the exposure process of the photosensitive material 1200', the wafer may be disposed on a carrier 1001' for temporary support. A material of the carrier 1001' construes no limitation in the disclosure as long the material is able to withstand the subsequent processes while carrying the package structure formed thereon. In some embodiments, a de-bonding layer (not illustrated) may be formed between the carrier 1001' and the wafer to enhance the releasability therebetween in the subsequent process. Subsequently, the wafer may be separated into the individual dies 100 by such as a dicing process, or other suitable separating process. In some embodiments, the dies 100 may be reconstituted such that a space (not illustrated) between the adjacent dies 100 may be expanded for the subsequent process. Next, an encapsulant 6000 may be formed in the space between the adjacent dies and surrounding each of the dies 100 to enhance the rigidity of package structure. In other word, the encapsulant 6000 may surround the peripheral portion 1200'b of the photosensitive material 1200'. For example, the encapsulant 6000 may be a molding compound formed by such as a molding process. In some embodiments, the encapsulant 6000 may be an insulating material such as epoxy, or other suitable resins.

In some embodiments, after forming the encapsulant 6000, a thinning process (e.g. a grinding process, a polishing process, or other suitable process) may be performed on the encapsulant 6000 to reduce the thickness of the structure. For example, a portion of the conductive connectors 2000 including the first conductive connectors 2100 and the second conductive connectors 2200 may be removed during the thinning process. In some embodiments, after performing the thinning process, a top surface 6000a of the encapsulant 6000 opposite to the carrier 1001' may be coplanar with the top surface of the conductive connectors 2000 opposite to the dies 100 and the top surface of the photosensitive material 1200' opposite to the dies 100.

Figure 3B:
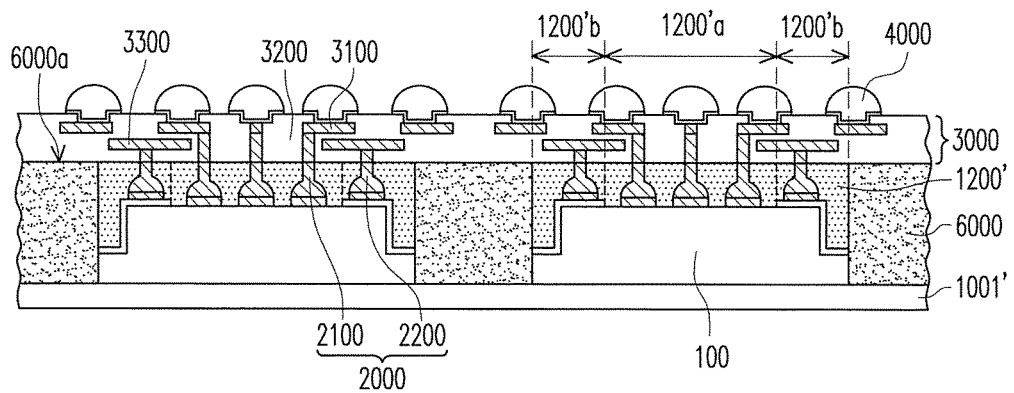

Referring to FIG. 3B, the redistribution layer 3000 including the signal-transmitting pattern 3100 coupled to the first conductive connectors 2100, the grounding pattern 3200 coupled to the second conductive connectors 2200 and the patterned dielectric layer 3300 may be formed on the top surface 6000a of the encapsulant 6000. In some embodiments, the conductive terminals 4000 may be formed on the redistribution layer 3000 to electrically connect to the dies 100 through the redistribution layer 3000 and the first conductive connectors 2100. In other words, the dies 100 may leverage the redistribution layer 3000 to fan out the conductive terminals 4000. The forming processes of the redistribution layer 3000 and the conductive terminals 4000 may be similar with the processes illustrated in FIG. 1C and the detailed descriptions are omitted herein. After forming the conductive terminals 4000, the carrier 1001' may be separated from the dies 100 and the encapsulant 6000.

Figure 3C:
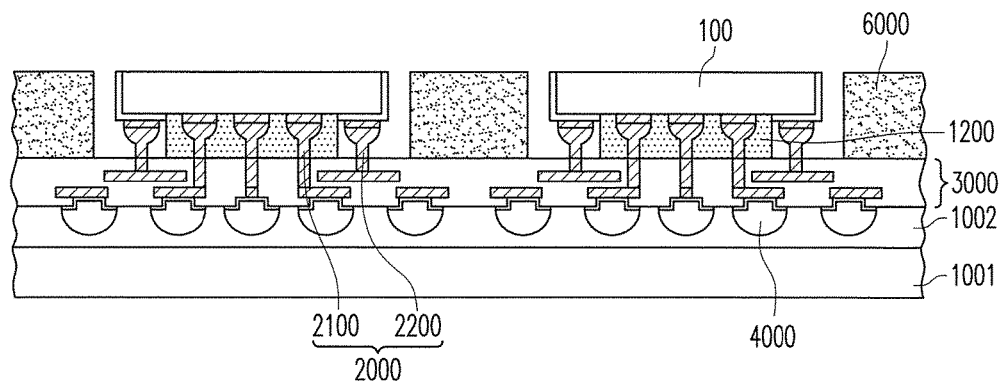

Referring to FIG. 3C, the dies 100 may be flipped upside down to dispose on the carrier 1001. In some embodiments, the de-bonding layer 1002 may be formed on the carrier 1001 for bonding to the redistribution layer 3000. In some other embodiments, a portion of the dies 100 may be removed by such as a grinding process, or other suitable process to expose at least a portion of the peripheral portion 1200'b of the photosensitive material 1200'. Subsequently, the peripheral portion 1200'b may be removed by such as a developing process to form the dielectric layer 1200. The forming process of the dielectric layer 1200 may be similar with the process illustrated in FIG. 1E and the detailed descriptions are omitted herein. As such, after the removing process of the peripheral portion 1200'b, the encapsulant 6000 may be spaced apart from the dielectric layer 1200.

Figure 3D:
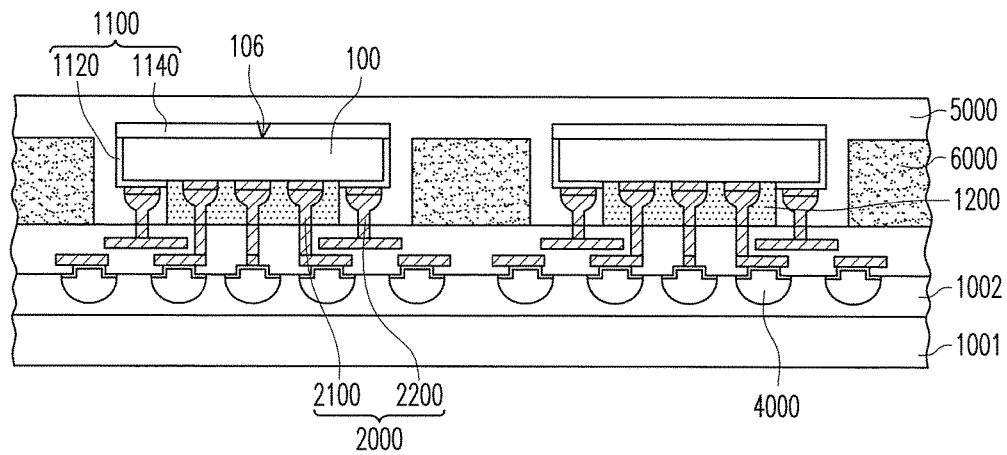

Referring to FIG. 3D, the second portion 1140 of the passivation layer 1100 may be formed to cover the back surface 106 of the dies 100. After forming the second portion 1140, the conductive shield 5000 may be formed on the redistribution layer 3000 to cover the first portion 1120 and the second portion 1140 of the passivation layer 1100 and the second conductive connectors 2200. The forming processes of the second portion 1140 of the passivation layer 1100 and the conductive shield 5000 may be similar with the processes illustrated in FIG. 1F. The detailed descriptions are omitted herein. In some embodiments, the encapsulant 6000 may be formed on the redistribution layer 3000 and surround the conductive shield 5000 after forming the conductive shield 5000. For example, after forming the conductive shield 5000 as illustrated in FIG. 1F, a dicing process and a re-constitution process may be performed between the dies 100 to expand the space between the adjacent dies 100. The encapsulant 6000 may be formed in the space between the adjacent dies and surrounding each of the dies 100. In some alternative embodiments, the conductive terminals 4000 may be formed after forming the conductive shield 5000.

Figure 3E:
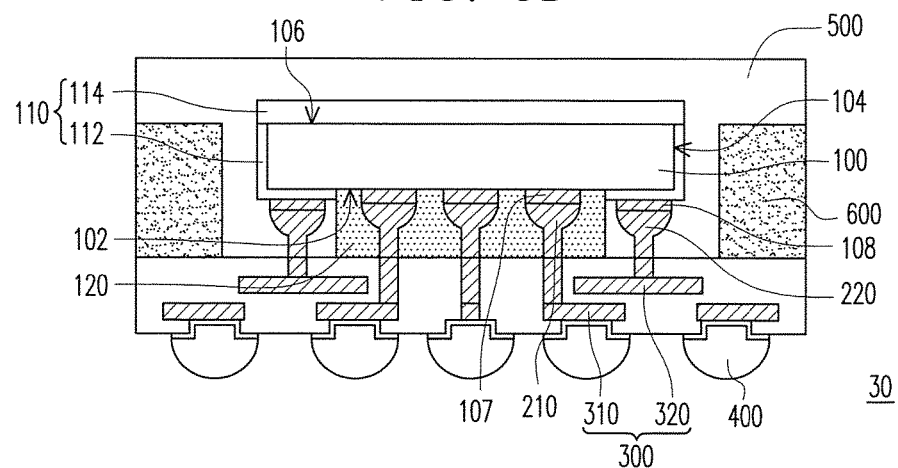

Referring to FIG. 3E, a singulation process may be performed and the carrier 1001 may be removed to form a package structure 30. The singulation process and the removing process of the carrier 1001 may be similar with the processes illustrated in FIG. 1G. The detailed descriptions are omitted herein. It should be noted that after performing the singulation process, similar numbers are used to refer to the singulated elements. The numbering rules of the singulated elements are as mentioned above and the details are not repeated herein.

The differences between the package structure 30 and the package structure 10 lie in that the encapsulant 600 of the package structure 30 may be disposed on the redistribution layer 300 and surround the conductive shield 500. The conductive shield 500 may be disposed between the encapsulant 500 and the die 100. A part of the conductive shield 500 and the redistribution layer 300 may be disposed at the two opposite sides of the encapsulant 600. In other word, the conductive shield 500 may cover a top surface and a side surface (connected to the top surface) of the encapsulant 500 while the redistribution layer 300 may cover a bottom surface (opposite to the top surface) of the encapsulant 500. As such, the encapsulant 600 may laterally encapsulate the die 100 for protecting the dies 100.

Figure 4:
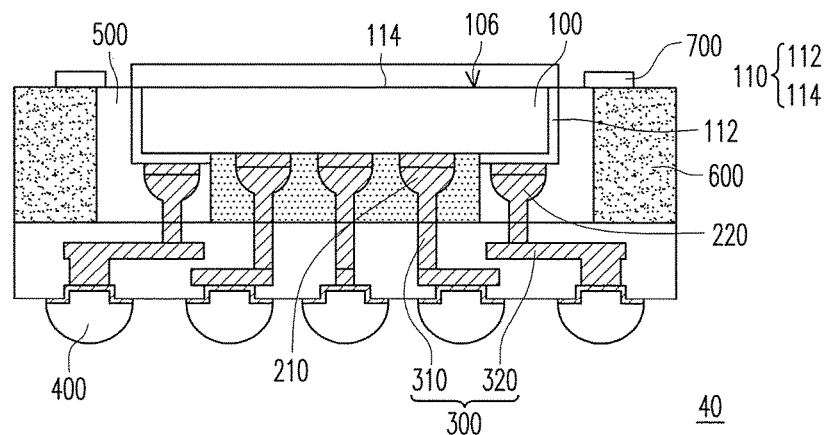
FIG. 4 is schematic cross-sectional views illustrating a package structure according to an embodiment of the disclosure.

FIG. 4 is a schematic cross-sectional view illustrating a package structure 40 according to an embodiment of the present invention. The manufacturing processes of the package structure 40 are similar with the manufacturing processes of the package structure 30. The differences therebetween lie in that before performing the singulation process, a plurality of contact pads may be formed on the conductive shield to electrically connect the redistribution layer through the conductive shield. In addition, a surface of the encapsulant opposite to the redistribution layer may be exposed by the conductive shield. Referring to FIG. 4, after performing the singulation process, the package structure 40 including contact pads 700 may be formed. In some embodiments, the conductive shield 500 may conformally cover the first portion 112 of the passivation layer 110 and expose the second portion 114 of the passivation layer 110. For example, the top surface of the encapsulant 600 facing the contact pads 700 may be coplanar with a surface of the conductive shield 500 facing the contact pads 700. The contact pads 700 are coupled to the grounding pattern 320 through the conductive shield 500 and the second conductive connectors 220. The contact pads 700 may serve as the ground pads for further electrical connection for package-on-package structures. In some other embodiments, the contact pads 700 may be formed to overlay on the conductive shield 500 and the encapsulant 600. The contact pads 700 may be aligned with the outermost conductive terminals 400 for stacking with other package structures. For example, a semiconductor package structure (not illustrated) may be stacked with the package structure 30 through contact pads 700 or conductive terminals 400 to form a Package-on-Package (POP) structure. As a result, it may open the possibility to various product designs. In some embodiments, a portion of the encapsulant 600 may partially cover the second conductive connectors 220.

Figure 5A:
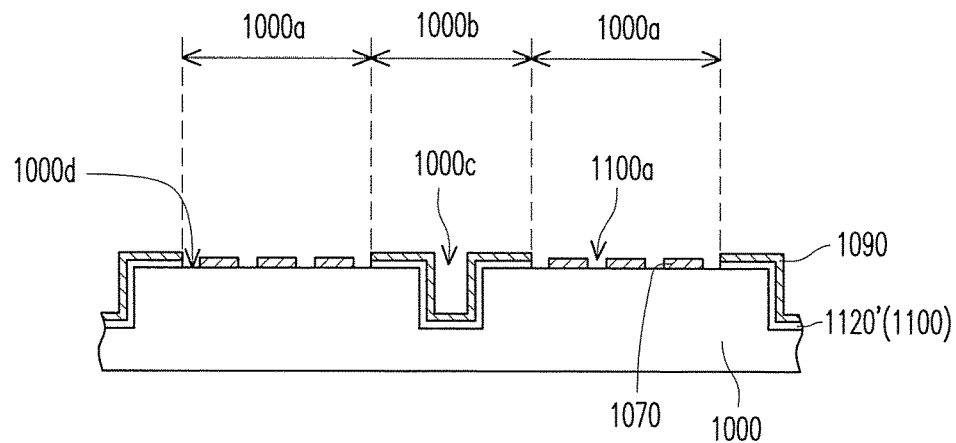
FIG. 5A to FIG. 5F are schematic cross-sectional views illustrating a manufacturing method of a package structure according to an embodiment of the disclosure.

FIG. 5A to FIG. 5F are schematic cross-sectional views illustrating a manufacturing method of a package structure according to an embodiment of the disclosure. Referring to FIG. 5A, the manufacturing processes may be similar with the manufacturing processes illustrated in FIG. 1A and the detailed descriptions are omitted. The difference between the present embodiment and the embodiment illustrated in FIG. 1A lies in that a seed layer 1090 may be conformally formed on the patterned passivation 1120'. For example, after forming the patterned passivation 1120' on the wafer 1000, the seed layer 1090 may conformally cover the patterned passivation 1120' through a deposition process, a lithography process and an etching process, or other suitable processes. A material of the seed layer 1090 may be copper, gold, nickel, or an alloy thereof, but is not limited thereto. In some embodiments, a seed material (not illustrated) may be conformally formed on the insulating material. Subsequently, the seed material and the insulating material may be patterned to form the seed layer 1090 and the patterned passivation 1120'. The seed layer 1090 and the patterned passivation 1120' may expose the first regions 1000a of the wafer 1000. In other word, the seed layer 1090 may include openings (not illustrated) corresponding to the openings 1100a. In some other embodiments, after forming the seed layer 1090, the first pads 1070 may be formed on the active surface 1000d and in the openings 1100a. The material and the forming process of the first pads 1070 may be similar with the embodiment illustrated in FIG. 1A and the detailed descriptions are omitted herein.

Figure 5B:
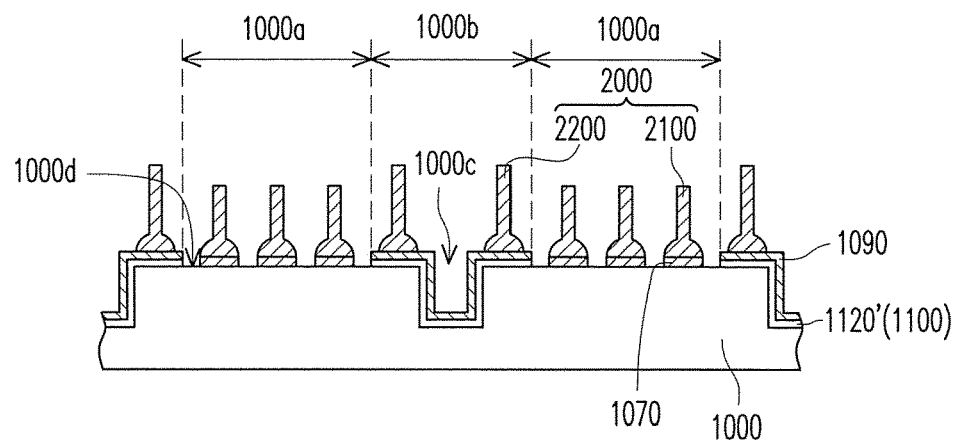

Referring to FIG. 5B, the conductive connectors 2000 including the first conductive connectors 2100 and the second conductive connectors 2200 may be formed correspondingly on the first regions 1000a and the second regions 1000b of the active surface 1000d. In other word, the first conductive connectors 2100 may be formed on the first pads 1070 and the second conductive connectors 2200 may be formed on the seed layer 1090. The materials and the forming processes of the first conductive connectors 2100 and second conductive connectors 2200 may be similar with the embodiment illustrated in FIG. 1B and the detailed descriptions are omitted herein. In the present embodiment, the seed layer 1090 may provide the same function as the second pads 1080 illustrated in FIG. 1B and/or for the formation of the conductive shield in the subsequent process.

Figure 5C:
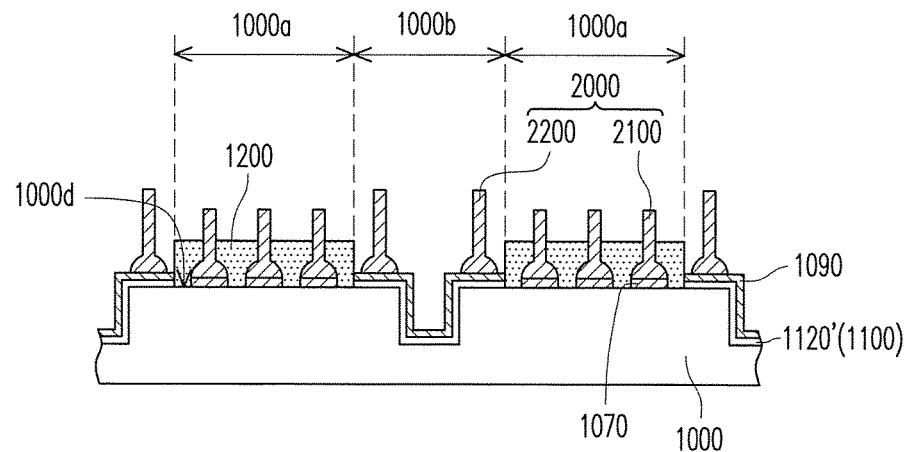

Referring to FIG. 5C, the dielectric layer 1200 may be formed on the first regions 1000a of the active surface 1000d of the wafer 1000 through a photolithography process. For example, the photosensitive material (not illustrated) may be formed on the active surface 1000d. Subsequently, the photosensitive material may be patterned through exposure and developing processes to form the dielectric layer 1200. In some embodiment, after forming the dielectric layer 1200, the thickness of the dielectric layer 1200 may be less than the overall height of the second conductive connectors 2200 with the seed layer 1090 and/or the overall height of the first conductive connectors 2100 with the first pads 1070.

Figure 5D:
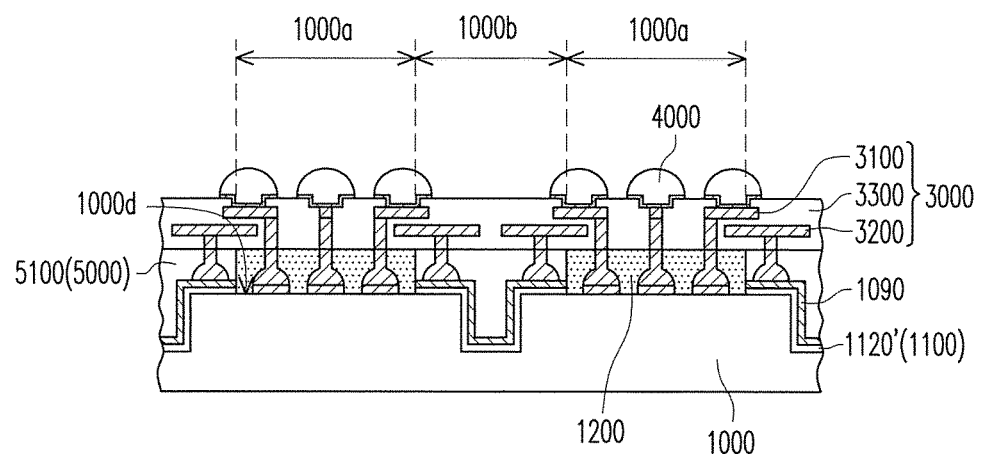

Referring to FIG. 5D, a first conductive portion 5100 of the conductive shield 5000 may be formed on the second regions 1000b of the active surface 1000d. For example, a conductive material (e.g. copper, aluminum, tin, gold, alloy, or the like) may be formed on the active surface 1000d through a plating process, or other suitable process. In other word, the conductive material may be formed on the seed layer 1090. In some embodiments, at least a portion of the conductive material formed beyond the second regions 1000b may be removed to form the first conductive portion 5100. In some other embodiments, a thinning process (e.g. a grinding process, a polishing process, or other suitable process) may be performed on the active surface 1000d of the wafer 1000 to reduce the thickness of the structure. For example, a portion of the conductive connectors 2000 including the first conductive connectors 2100 and the second conductive connectors 2200, the conductive material, and/or a portion of the dielectric layer 1200 may be removed in the same process. After performing the thinning process, a top surface (not illustrated) of the conductive connectors 2000 facing away from the active surface 1000d may be coplanar with a top surface (not illustrated) of the dielectric layer 1200 and a top surface (not illustrated) of the first conductive portion 5100.

Subsequently, the redistribution layer 3000 may be formed on the conductive connectors 2000 to electrically connect the first conductive connectors 2100, the second conductive connectors 2200 and the first conductive portion 5100. In some embodiments, the conductive terminals 4000 may be formed on the redistribution layer 3000 to electrically connect the signal-transmitting pattern 3100. In this way, the conductive terminals 4000 may be electrically connected to the wafer 1000 through the redistribution layer 3000 and the first conductive connectors 2100. The forming processes of the redistribution layer 3000 and the conductive terminals 4000 may be similar with the embodiment illustrated in FIG. 1D and the detailed descriptions are omitted herein.

Figure 5E:
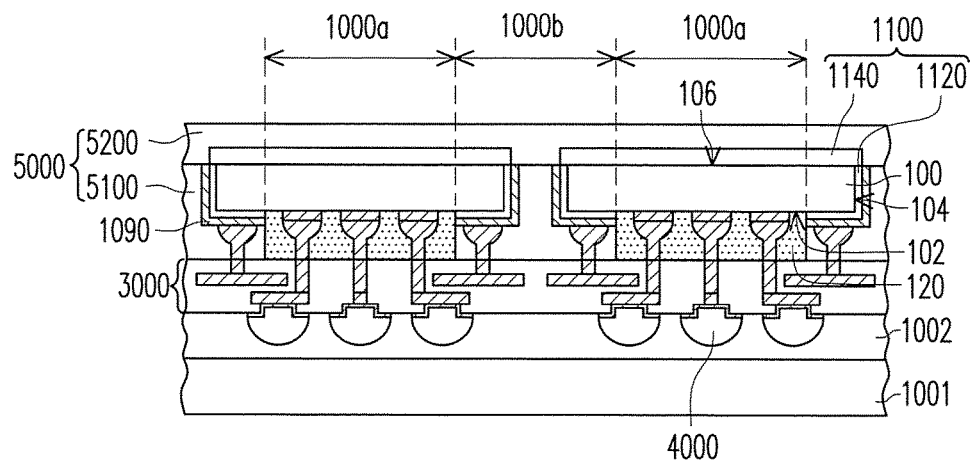

Referring to FIG. 5E, the wafer 1000 may be flipped upside down to dispose on the carrier 1001 for temporary support. In some embodiments, the de-bonding layer 1002 may be formed on the carrier 1001. The materials of the carrier 1001 and the de-bonding layer 1002 may be similar with the embodiment illustrated in FIG. 1E and the detailed descriptions are omitted herein. In some other embodiments, a portion of the wafer 1000 may be removed and the first conductive portion 5100 of the conductive shield 5000 may be exposed by the wafer 1000. After removing the portion of the wafer 1000, a plurality of individual dies 100 may be formed. The removing process of the wafer 1000 may be similar with the embodiment illustrated in FIG. 1E and the detailed descriptions are omitted herein.

After forming the dies 100, the second portion 1140 of the passivation layer 1100 may be formed on the back surface 106 of the dies 100. The forming process of the second portion 1140 may be similar with the embodiment illustrated in FIG. 1F and the detailed descriptions are omitted herein. In some embodiments, after forming the second portion 1140 of the passivation layer 1100, a second conductive portion 5200 connected to the first conductive portion 5100 of the conductive shield 5000 may be formed on the back surface 106 of the dies 100 through a plating process, or other suitable process. A material of the second conductive portion 5200 may be the same or similar with the first conductive portion 5100. In the aforementioned embodiments or other embodiments, the conductive shield 5000 may include the first conductive portion 5100 covering the side wall 104 and a portion of the active surface 102 of the dies 100 and the second conductive portion 5200 covering the back surface 106 of the dies 100. For example, the first conductive portion 5100 and the second conductive portion 5200 may be formed in the same or separated process depending on the process requirement. In some embodiments, before forming the second conductive portion 5200, a metallic layer (not illustrated) may be formed at least on the second portion 1140 of the passivation layer 110 through a lamination process, or other suitable process. The metallic layer may serve as a seed layer and the second conductive portion 5200 may be formed on the metallic layer.

Figure 5F:
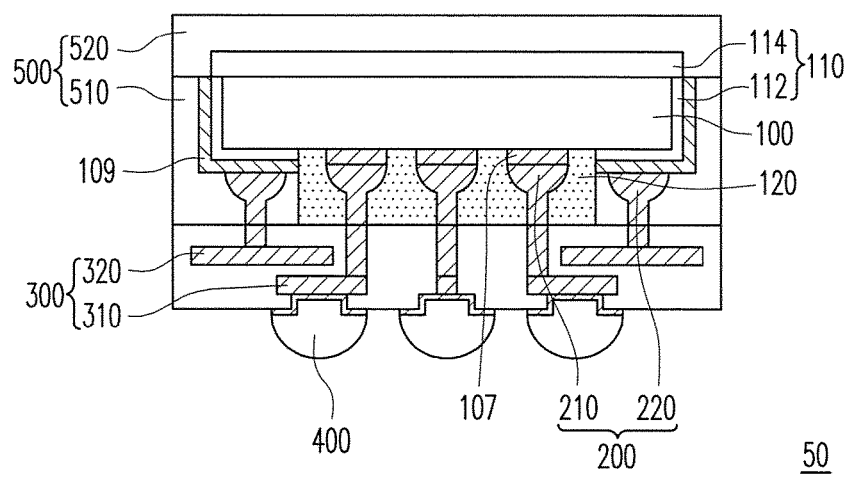

Referring to FIG. 5F, a singulation process may be performed and the carrier 1001 may be removed to form a package structure 50. The singulation process and the removing process of the carrier 1001 may be similar with the processes illustrated in FIG. 1G. The detailed descriptions are omitted herein. It should be noted that after performing the singulation process, similar numbers are used to refer to the singulated elements. The numbering rules of the singulated elements are as mentioned above and the details are not repeated herein.

The differences between the package structure 50 and the package structure 10 lie in that the seed layer 109 of the package structure 50 may be disposed between the passivation layer 110 and the second conductive connectors 220. In other words, the first portion 112 of the passivation layer 110 may be conformally covered by the seed layer 109. The conductive shield 500 may include the first conductive portion 510 covering the first portion 112 of the passivation layer 110 and the second conductive portion 520 connected to the first conductive portion 510 and covering the second portion 114 of the passivation layer 110.

Figure 6A:
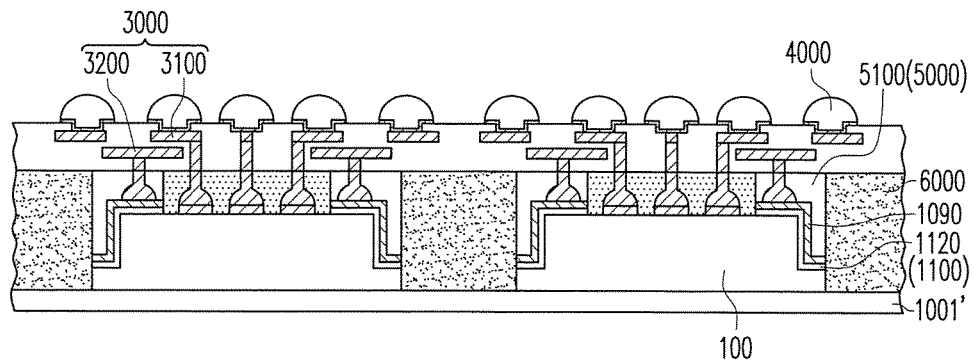
FIG. 6A to FIG. 6C are schematic cross-sectional views illustrating a manufacturing method of a package structure according to an embodiment of the disclosure.
Figure 6B:
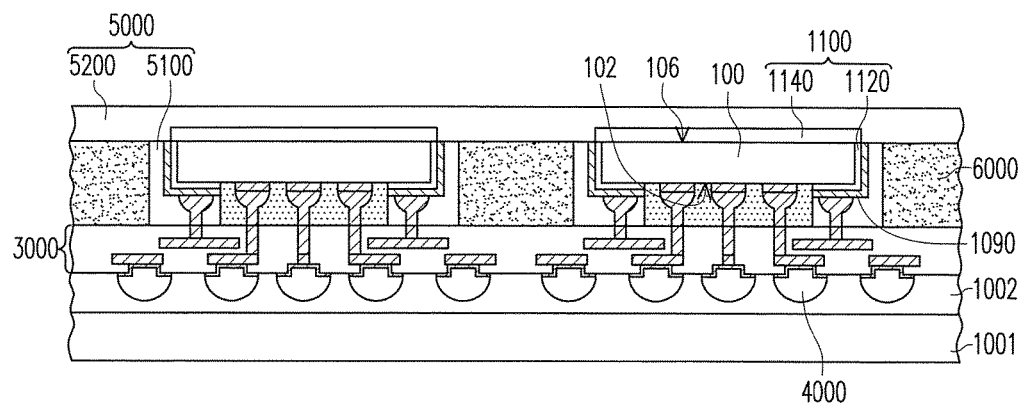
Figure 6C:
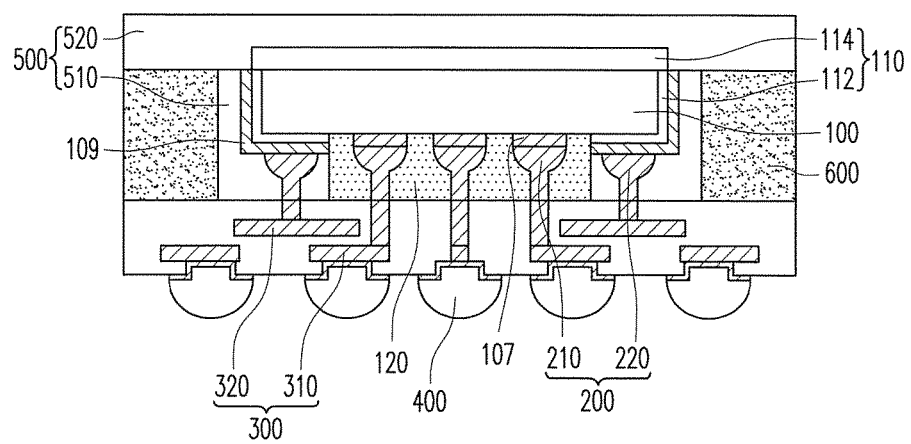

FIG. 6A to FIG. 6C are schematic cross-sectional views illustrating a manufacturing method of a package structure according to an embodiment of the present invention. The manufacturing processes of the present embodiment may be similar with the manufacturing processes illustrated in FIG. 5A to FIG. 5D and the detailed descriptions are omitted herein. Referring to FIG. 6A, after performing the thinning process but before forming the redistribution layer as described in FIG. 5D, the wafer may be singulated to form individual dies 100 and the individual dies 100 are disposed separately from each other on the carrier 1001' for temporary support. Next, the encapsulant 6000 may be formed in the space between the adjacent dies 100 and surrounding each of the dies 100 for protection. In some embodiments, the thinning process may be performed on the encapsulant 6000 to reduce the thickness of the structure. In some other embodiments, according to the design requirements, a portion of the dies 100 accompany with a portion of the first portion 1120 of the passivation layer 1100 and the seed layer 1090 formed thereon may be removed during reducing the thickness of the encapsulant 6000 to expose a surface of the first conductive portion 5100 of the conductive shield 5000 facing away the redistribution layer 3000. For example, after reducing the thinning process, the surface of the encapsulant 6000 facing away from the redistribution layer 3000 may be coplanar with the surface of the first conductive portion 5100, the back surface 106 of the dies 100, the surface of the first portion 1120 and the surface of the seed layer 1090. The material and the forming process of the encapsulant 6000 may be similar with the embodiment illustrated in FIG. 3A and the detailed descriptions are omitted herein.

Next, the redistribution layer 3000 including the signal-transmitting pattern 3100, the grounding pattern 3200, and the patterned dielectric layer 3300 may be formed on the top surface 6000a of the encapsulant 6000 such that the signal-transmitting pattern 3100 may be coupled to the first conductive connectors 2100 and the grounding pattern 3200 may be coupled to the second conductive connectors 2200. In some embodiments, the conductive terminals 4000 may be formed on the redistribution layer 3000 corresponding to the dies 100 and/or the encapsulant 6000. The forming processes of the redistribution layer 3000 and the conductive terminals 4000 may be similar with the embodiment illustrated in FIG. 3B and the detailed descriptions are omitted herein. After forming the conductive terminals 4000, the carrier 1001' may be separated from the dies 100 and the encapsulant 6000.

Referring to FIG. 6B, the dies 100 may be flipped upside down to dispose on the carrier 1001 such that the active surface 102 of the die 100 may face to the carrier 1001. In some embodiments, the de-bonding layer 1002 may be formed on the carrier 1001 for bonding to the redistribution layer 3000. In some other embodiments, a portion of the dies 100 may be removed through a grinding process to expose at least a portion of the first conductive portion 5100. After the removing process, a surface (not illustrated) of the encapsulant 6000 opposite to the redistribution layer 3000 and a surface (not illustrated) of the first conductive portion 5100 opposite to the redistribution layer 3000 may be coplanar with the back surface 106 of the dies 100.

Next, the second portion 1140 of the passivation layer 1100 may be formed on the back surface 106 of the dies 100. The forming process of the second portion 1140 may be similar with the embodiment illustrated in FIG. 3D and the detailed descriptions are omitted herein. Subsequently, the second conductive portion 5200 connected to the first conductive portion 5100 of the conductive shield 5000 may be formed on the back surface 106 of the dies 100 to cover the encapsulant 6000, the seed layer 1090 and the second portion 1140 of the passivation layer 1100.

Referring to FIG. 6C, a singulation process may be performed and the carrier 1001 may be removed to form a package structure 60. The singulation process and the removing process of the carrier 1001 may be similar with the processes illustrated in FIG. 5F. The detailed descriptions are omitted herein. It should be noted that after performing the singulation process, similar numbers are used to refer to the singulated elements. The numbering rules of the singulated elements are as mentioned above and details are not repeated herein. The differences between the package structure 60 and the package structure 50 lie in that the encapsulant 600 of the package structure 60 may surround the die 100 and be disposed between the second conductive portion 520 and the redistribution layer 300. In other word, the encapsulant 600 may laterally encapsulate the die 100 for protection. The conductive shield 500 may include the first conductive portion 510 covering the first portion 112 of the passivation layer 110 and the second conductive portion 520 connected to the first conductive portion 510 and covering the second portion 114 of the passivation layer 110.

Figure 7A:
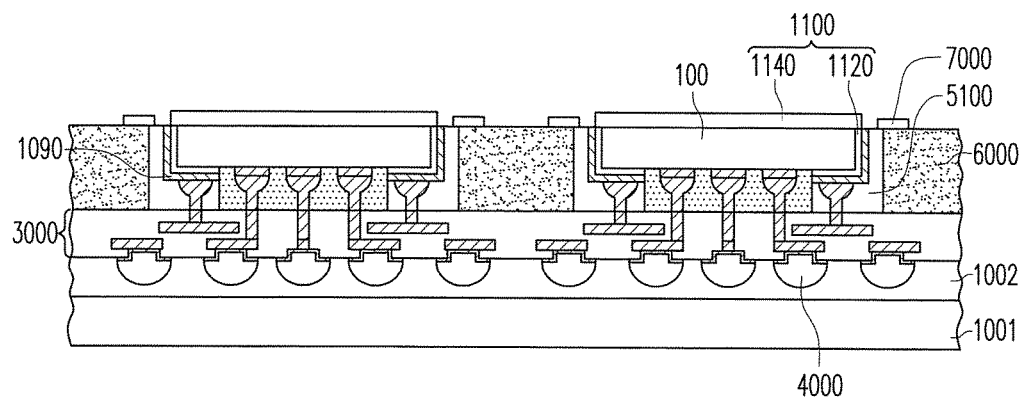
FIG. 7A to FIG. 7B are schematic cross-sectional views illustrating a manufacturing method of a package structure according to an embodiment of the disclosure.
Figure 7B:
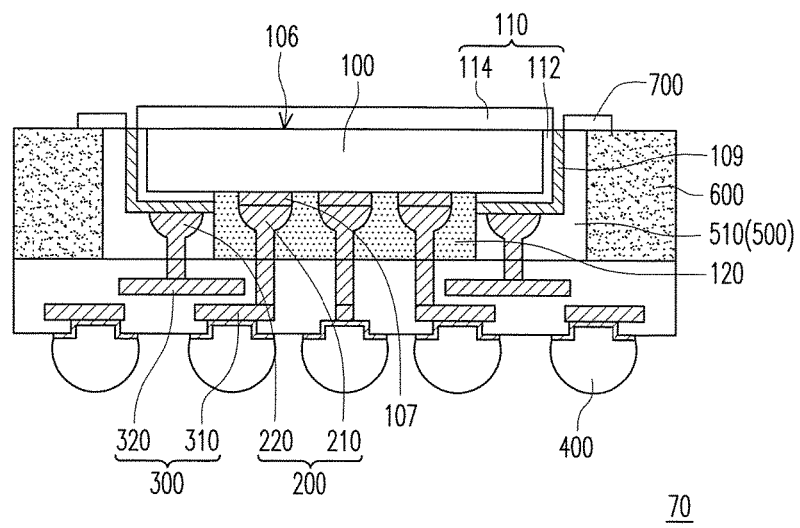

FIG. 7A to FIG. 7B are cross-sectional views illustrating a manufacturing method of a package structure according to an embodiment of the disclosure. The manufacturing processes of the present embodiment may be similar with the manufacturing processes illustrated in FIG. 6A and FIG. 6B and the detailed descriptions are omitted herein. Referring to FIG. 7A, after forming the second portion 1140 of the passivation layer 1100, at least a part of each of the contact pads 7000 may be formed on the first conductive portion 5100. For example, the contact pads 7000 may surround the second portion 1140 of the passivation layer 1100. In some embodiments, the contact pads 700 may be spaced apart formed the second portion 1140 of the passivation layer 1100. In some other embodiments, the contact pads 7000 may be formed to overlay both of the first conductive portion 5100 and the encapsulant 6000. In other word, the contact pads 7000 may be aligned with the outermost conductive terminals 4000 for stacking with other package structure.

Referring to FIG. 7B, after forming the contact pads 7000, a singulation process may be performed and the carrier 1001 may be removed to form a package structure 70. The singulation process and the removing process of the carrier 1001 may be similar with the processes illustrated in FIG. 6C. The detailed descriptions are omitted herein. It should be noted that after performing the singulation process, similar numbers are used to refer to the singulated elements. The numbering rules of the singulated elements are as mentioned above and the details are not repeated herein.

The differences between the package structure 70 and the package structure 60 lie in that the contact pads 700 of the package structure 70 may be disposed on the first conductive portion 510 of the conductive shield 500 instead of the second conductive portion 520. The contact pads 700 are coupled to the grounding pattern 320 through the conductive shield 500 and the second conductive connectors 220. The contact pads 700 may serve as the ground pads for further electrical connection for package-on-package structures. For example, a semiconductor package structure (not illustrated) may be stacked with the package structure 70 through contact pads 700 or conductive terminals 400 to form a POP structure. As a result, it may open the possibility to various product designs.

Based on the foregoing, the conductive shield surrounding the die may provide the EMI shielding function and/or the heat-discharging function, thereby achieving the package structure with both electromagnetic shielding and thermal dissipation. In addition, the first portion and the second portion of the passivation layer covering the die may electrically insulate the die from the second conductive connectors and the conductive shield and also may protect the die. Moreover, the second conductive connectors disposed in the peripheral region of the die and connected to the grounding pattern while the first conductive connectors disposed in the central region of the die and connected to the signal-transmitting pattern may simplify the package structure, thereby achieving the miniaturization package design. In addition, the encapsulant may surround the conductive shield to laterally encapsulate the die to enhance the rigidity of the package structure and/or for a subsequent fan-out process. Furthermore, the contact pads and/or the conductive terminals disposed on the two opposite sides of the package structure may provide the further electrical connection. As a result, it may open the possibility to various product designs.

In accordance with an embodiment, a manufacturing method of a package structure includes the following steps. A plurality of first conductive connectors and a second conductive connector on an active surface of a die are formed. The first conductive connectors are electrically connected to the die. The second conductive connector is formed aside the first conductive connectors and is electrically insulated from the die. A redistribution layer is formed on the die. The redistribution layer is electrically connected to the first conductive connectors and the second conductive connector. A conductive shield is formed on the redistribution layer to surround the second conductive connector and at least a portion of a sidewall of the die coupled the active surface. The die is electrically insulated from the conductive shield. In some embodiments, an insulating material is formed on the die and the insulating material is patterned to form a passivation layer before disposing the first conductive connectors and the second conductive connector. The passivation layer exposes the active surface of the die, and the die is electrically insulated from the second conductive connectors and the conductive shield through the passivation layer after forming the conductive shield. In some embodiments, a plurality of conductive terminals are formed on the redistribution layer opposite to the die before forming the conductive shield. The conductive terminals are electrically connected to the die through the redistribution layer and the first conductive connectors. In some embodiments, a photosensitive material is formed on the active surface of the die before forming the redistribution layer. The photosensitive material includes a central portion and a peripheral portion surrounding to the central portion, the central portion covers the first conductive connectors and the peripheral portion covers the second conductive connector. In some embodiments, the peripheral portion of the photosensitive material is removed to form a dielectric layer before forming the conductive shield, wherein the dielectric layer covers the first conductive connectors. In some embodiments, an encapsulant is formed surrounding the die after forming the photosensitive material. The encapsulant surrounds the peripheral portion of the photosensitive material. In some embodiments, the peripheral portion of the photosensitive material is removed to form a dielectric layer after forming the redistribution layer. The encapsulant is spaced apart from the dielectric layer. In some embodiments, an encapsulant is formed on the redistribution layer and surrounding the conductive shield. In some embodiments, a plurality of contact pads are formed on at least a part of the conductive shield. The contact pads are electrically connected to the redistribution layer through the conductive shield. In some embodiments, the step of forming the redistribution layer includes forming a signal-transmitting pattern and a grounding pattern. The signal-transmitting pattern is electrically connected to the first conductive connectors and the grounding pattern is electrically connected to the second conductive connector.

A first embodiment of the present invention discloses a manufacturing method of a package structure. The method includes the following steps. A wafer is provided, wherein the wafer includes a plurality of first regions and a plurality of second regions, each of the second regions is connected to one of the first regions, respectively, the second regions are electrically insulated. An insulating material is formed on the wafer. The insulating material is patterned to form a passivation layer, wherein the passivation layer exposes the first regions of the wafer, the wafer is electrically insulated from the conductive connectors disposed on the second regions through the passivation layer. A plurality of conductive connectors are disposed on the first regions and the second regions of the wafer. A photosensitive material is formed on the wafer, wherein the photosensitive material includes a central portion corresponding to the first regions of the wafer and a peripheral portion corresponding the second regions of the wafer. A redistribution layer is formed on the conductive connectors to electrically connect the conductive connectors. Forming the redistribution layer includes forming a signal-transmitting pattern and a grounding pattern, the signal-transmitting pattern is electrically connected to the conductive connectors disposed on the first regions of the wafer and the grounding pattern is electrically connected to the conductive connectors disposed on the second regions of the wafer. A plurality of conductive terminals are formed on the redistribution layer. A portion of the wafer is removed to form a plurality of dies, wherein each of the dies includes one of the first regions and one of the second regions, the dies are electrically connected to the redistribution layer through the conductive connectors corresponding to the first regions. The peripheral portion of the photosensitive material is removed to form a dielectric layer, wherein the dielectric layer covers the conductive connectors on the first regions. A conductive shield is formed on the redistribution layer to cover the dies, wherein the conductive shield is electrically insulated from the dies. A singulation process is performed to form a package structure.

A second embodiment of the present invention discloses a manufacturing method of a chip structure. The method includes the following steps. A wafer is provided, wherein the wafer includes a plurality of first regions and a plurality of second regions, each of the second regions is connected to one of the first regions, respectively, the second regions are electrically insulated. An insulating material is formed on the wafer. The insulating material is patterned to form a passivation layer, wherein the passivation layer exposes the first regions of the wafer, the wafer is electrically insulated from the conductive connectors disposed on the second regions through the passivation layer. A plurality of conductive connectors are disposed on the first regions and the second regions of the wafer. A photosensitive material is formed on the wafer, wherein the photosensitive material includes a central portion corresponding to the first regions of the wafer and a peripheral portion corresponding the second regions of the wafer. The peripheral portion of the photosensitive material is removed to form a dielectric layer, wherein the dielectric layer covers the conductive connectors on the first regions. A conductive shield is formed on the redistribution layer to cover the dies, wherein the conductive shield is electrically insulated from the dies. A singulation process is performed to form a package structure.

A third embodiment of the present invention discloses a manufacturing method of a package structure. The method includes the following steps. A wafer is provided, wherein the wafer includes a plurality of first regions and a plurality of second regions, each of the second regions is connected to one of the first regions, respectively, the second regions are electrically insulated. An insulating material is formed on the wafer. The insulating material is patterned to form a passivation layer, wherein the passivation layer exposes the first regions of the wafer, the wafer is electrically insulated from the conductive connectors disposed on the second regions through the passivation layer. A plurality of conductive connectors are disposed on the first regions and the second regions of the wafer. A photosensitive material is formed on the wafer, wherein the photosensitive material includes a central portion corresponding to the first regions of the wafer and a peripheral portion corresponding the second regions of the wafer. An encapsulant is formed, wherein the encapsulant surrounds the peripheral portion of the photosensitive material. A redistribution layer is formed on the conductive connectors to electrically connect the conductive connectors. Forming the redistribution layer includes forming a signal-transmitting pattern and a grounding pattern, the signal-transmitting pattern is electrically connected to the conductive connectors disposed on the first regions of the wafer and the grounding pattern is electrically connected to the conductive connectors disposed on the second regions of the wafer. A plurality of conductive terminals are formed on the redistribution layer. A portion of the wafer is removed to form a plurality of dies, wherein each of the dies includes one of the first regions and one of the second regions, the dies are electrically connected to the redistribution layer through the conductive connectors corresponding to the first regions and the encapsulant surrounds the dies. The peripheral portion of the photosensitive material is removed to form a dielectric layer, wherein the dielectric layer covers the conductive connectors on the first regions and the encapsulant is spaced apart from the dielectric layer. A conductive shield is formed on the redistribution layer to cover the dies, wherein the conductive shield is electrically insulated from the dies. A singulation process is performed to form a package structure.

A fourth embodiment of the present invention discloses a manufacturing method of a package structure. The method includes the following steps. A wafer is provided, wherein the wafer includes a plurality of first regions and a plurality of second regions, each of the second regions is connected to one of the first regions, respectively, the second regions are electrically insulated. An insulating material is formed on the wafer. The insulating material is patterned to form a passivation layer, wherein the passivation layer exposes the first regions of the wafer, the wafer is electrically insulated from the conductive connectors disposed on the second regions through the passivation layer. A plurality of conductive connectors are disposed on the first regions and the second regions of the wafer. A photosensitive material is formed on the wafer, wherein the photosensitive material includes a central portion corresponding to the first regions of the wafer and a peripheral portion corresponding the second regions of the wafer. An encapsulant is formed surrounding each of the dies, wherein the encapsulant surrounds the peripheral portion of the photosensitive material. A redistribution layer is formed on the conductive connectors to electrically connect the conductive connectors. Forming the redistribution layer includes forming a signal-transmitting pattern and a grounding pattern, the signal-transmitting pattern is electrically connected to the conductive connectors disposed on the first regions of the wafer and the grounding pattern is electrically connected to the conductive connectors disposed on the second regions of the wafer. A plurality of conductive terminals are formed on the redistribution layer. A portion of the wafer is removed to form a plurality of dies, wherein each of the dies includes one of the first regions and one of the second regions, the dies are electrically connected to the redistribution layer through the conductive connectors corresponding to the first regions. The peripheral portion of the photosensitive material is removed to form a dielectric layer, wherein the dielectric layer covers the conductive connectors on the first regions and the encapsulant is spaced apart from the dielectric layer. A conductive shield is formed on the redistribution layer to cover the dies, wherein the conductive shield is electrically insulated from the dies. A plurality of contact pads are formed on at least a part of the conductive shield, wherein the contact pads are electrically connected to the redistribution layer through the conductive shield. A singulation process is performed to form a package structure.

A fifth embodiment of the present invention discloses a manufacturing method of a package structure. The method includes the following steps. A wafer is provided, wherein the wafer includes a plurality of first regions and a plurality of second regions, each of the second regions is connected to one of the first regions, respectively, the second regions are electrically insulated. An insulating material is formed on the wafer. The insulating material is patterned to form a passivation layer, wherein the passivation layer exposes the first regions of the wafer, the wafer is electrically insulated from the conductive connectors disposed on the second regions through the passivation layer. A seed layer is conformally formed on the passivation layer. A plurality of conductive connectors are disposed on the first regions and the second regions of the wafer. A photosensitive material is formed on the wafer, wherein the photosensitive material includes a central portion corresponding to the first regions of the wafer and a peripheral portion corresponding the second regions of the wafer. The peripheral portion of the photosensitive material is removed to form a dielectric layer, wherein the dielectric layer covers the conductive connectors on the first regions. A first conductive portion of a conductive shield is formed. A redistribution layer is formed on the conductive connectors to electrically connect the conductive connectors. The first conductive portion of the conductive shield is formed on the redistribution layer to cover the dies, wherein the conductive shield is electrically insulated from the dies. Forming the redistribution layer includes forming a signal-transmitting pattern and a grounding pattern, the signal-transmitting pattern is electrically connected to the conductive connectors disposed on the first regions of the wafer and the grounding pattern is electrically connected to the conductive connectors disposed on the second regions of the wafer. A plurality of conductive terminals are formed on the redistribution layer. A portion of the wafer is removed to form a plurality of dies, wherein each of the dies includes one of the first regions and one of the second regions, the dies are electrically connected to the redistribution layer through the conductive connectors corresponding to the first regions. A second conductive portion of the conductive shield connected to the first conductive portion is formed on the back surface of the dies. A singulation process is performed to form a package structure.

A sixth embodiment of the present invention discloses a manufacturing method of a package structure. The method includes the following steps. A wafer is provided, wherein the wafer includes a plurality of first regions and a plurality of second regions, each of the second regions is connected to one of the first regions, respectively, the second regions are electrically insulated. An insulating material is formed on the wafer. The insulating material is patterned to form a passivation layer, wherein the passivation layer exposes the first regions of the wafer, the wafer is electrically insulated from the conductive connectors disposed on the second regions through the passivation layer. A seed layer is conformally formed on the passivation layer. A plurality of conductive connectors are disposed on the first regions and the second regions of the wafer. A photosensitive material is formed on the wafer, wherein the photosensitive material includes a central portion corresponding to the first regions of the wafer and a peripheral portion corresponding the second regions of the wafer. The peripheral portion of the photosensitive material is removed to form a dielectric layer, wherein the dielectric layer covers the conductive connectors on the first regions. A first conductive portion of a conductive shield is formed. A portion of the wafer is removed and an encapsulant is formed, wherein the encapsulant surrounds the first conductive portion of the conductive shield. A redistribution layer is formed on the conductive connectors to electrically connect the conductive connectors. Forming the redistribution layer includes forming a signal-transmitting pattern and a grounding pattern, the signal-transmitting pattern is electrically connected to the conductive connectors disposed on the first regions of the wafer and the grounding pattern is electrically connected to the conductive connectors disposed on the second regions of the wafer. A plurality of conductive terminals are formed on the redistribution layer. A portion of the wafer is removed to form a plurality of dies, wherein each of the dies includes one of the first regions and one of the second regions, the dies are electrically connected to the redistribution layer through the conductive connectors corresponding to the first regions. A second conductive portion of the conductive shield connected to the first conductive portion is formed on the back surface of the dies. A singulation process is performed to form a package structure.

A seventh embodiment of the present invention discloses a manufacturing method of a package structure. The method includes the following steps. A wafer is provided, wherein the wafer includes a plurality of first regions and a plurality of second regions, each of the second regions is connected to one of the first regions, respectively, the second regions are electrically insulated. An insulating material is formed on the wafer. The insulating material is patterned to form a passivation layer, wherein the passivation layer exposes the first regions of the wafer, the wafer is electrically insulated from the conductive connectors disposed on the second regions through the passivation layer. A seed layer is conformally formed on the passivation layer. A plurality of conductive connectors are disposed on the first regions and the second regions of the wafer. A photosensitive material is formed on the wafer, wherein the photosensitive material includes a central portion corresponding to the first regions of the wafer and a peripheral portion corresponding the second regions of the wafer. The peripheral portion of the photosensitive material is removed to form a dielectric layer, wherein the dielectric layer covers the conductive connectors on the first regions. A conductive shield is formed. A portion of the wafer is removed and an encapsulant is formed, wherein the encapsulant surrounds the first conductive portion of the conductive shield. A redistribution layer is formed on the conductive connectors to electrically connect the conductive connectors. Forming the redistribution layer includes forming a signal-transmitting pattern and a grounding pattern, the signal-transmitting pattern is electrically connected to the conductive connectors disposed on the first regions of the wafer and the grounding pattern is electrically connected to the conductive connectors disposed on the second regions of the wafer. A plurality of conductive terminals are formed on the redistribution layer. A portion of the wafer is removed to form a plurality of dies, wherein each of the dies includes one of the first regions and one of the second regions, the dies are electrically connected to the redistribution layer through the conductive connectors corresponding to the first regions. A plurality of contact pads are formed on at least a part of the conductive shield, wherein the contact pads are electrically connected to the redistribution layer through the conductive shield. A singulation process is performed to form a package structure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A manufacturing method of a package structure, comprising:
    forming a plurality of first conductive connectors and a second conductive connector on an active surface of a die, wherein the first conductive connectors are electrically connected to the die, the second conductive connector is formed aside the first conductive connectors and is electrically insulated from the die;
    forming a redistribution layer on the die, wherein the redistribution layer is electrically connected to the first conductive connectors and the second conductive connector; and
    forming a conductive shield on the redistribution layer to surround the second conductive connector and at least a portion of a sidewall of the die, wherein a portion of the conductive shield is formed between the active surface of the die and the redistribution layer, and the die is electrically insulated from the conductive shield.

2. The manufacturing method according to claim 1 further comprising:
    forming an insulating material on the die; and
    patterning the insulating material to form a passivation layer before disposing the first conductive connectors and the second conductive connector, wherein the passivation layer exposes the active surface of the die, the die is electrically insulated from the second conductive connectors and the conductive shield through the passivation layer after forming the conductive shield.

3. The manufacturing method according to claim 1 further comprising:
forming a plurality of conductive terminals on the redistribution layer opposite to the die before forming the conductive shield, wherein the conductive terminals are electrically connected to the die through the redistribution layer and the first conductive connectors.

4. The manufacturing method according to claim 1 further comprising:
forming a photosensitive material on the active surface of the die before forming the redistribution layer, wherein the photosensitive material comprises a central portion and a peripheral portion surrounding to the central portion, the central portion covers the first conductive connectors and the peripheral portion covers the second conductive connector.

5. The manufacturing method according to claim 4 further comprising:
removing the peripheral portion of the photosensitive material to form a dielectric layer before forming the conductive shield, wherein the dielectric layer covers the first conductive connectors.

6. The manufacturing method according to claim 4 further comprising:
forming an encapsulant surrounding the die after forming the photosensitive material, wherein the encapsulant surrounds the peripheral portion of the photosensitive material.

7. The manufacturing method according to claim 6 further comprising:
removing the peripheral portion of the photosensitive material to form a dielectric layer after forming the redistribution layer, wherein the encapsulant is spaced apart from the dielectric layer.

8. The manufacturing method according to claim 1 further comprising:
forming an encapsulant on the redistribution layer and surrounding the conductive shield.

9. The manufacturing method according to claim 1 further comprising:
forming a plurality of contact pads on at least a part of the conductive shield, wherein the contact pads are electrically connected to the redistribution layer through the conductive shield.

10. The manufacturing method according to claim 1, wherein forming the redistribution layer comprises forming a signal-transmitting pattern and a grounding pattern, the signal-transmitting pattern is electrically connected to the first conductive connectors and the grounding pattern is electrically connected to the second conductive connector.

11. A manufacturing method of a package structure, comprising:
providing a wafer, wherein the wafer comprises a plurality of first regions and a plurality of second regions, each of the second regions is connected to one of the first regions, respectively, the second regions are electrically insulated;
disposing a plurality of conductive connectors on the first regions and the second regions of the wafer;
forming a redistribution layer on the conductive connectors to electrically connect the conductive connectors;
removing a portion of the wafer to form a plurality of dies, wherein each of the dies comprises one of the first regions and one of the second regions, the dies are electrically connected to the redistribution layer through the conductive connectors corresponding to the first regions;
forming a conductive shield on the redistribution layer to surround the conductive connectors on the second regions and cover the dies, wherein a portion of the conductive shield is formed between an active surface of each of the dies and the redistribution layer, and the conductive shield is electrically insulated from the dies; and
performing a singulation process to form a package structure;
wherein the disposing the plurality of conductive connectors on the first regions and the second regions of the wafer comprises forming a plurality of first conductive connectors and a second conductive connector on an active surface of each die, wherein the first conductive connectors of each die are electrically connected to the die, the second conductive connector of each die is formed aside the first conductive connectors of each die and is electrically insulated from the die.

12. The manufacturing method according to claim 11 further comprising:
forming an insulating material on the wafer; and
patterning the insulating material to form a passivation layer before disposing the conductive connectors, wherein the passivation layer exposes the first regions of the wafer, the wafer is electrically insulated from the conductive connectors disposed on the second regions through the passivation layer.

13. The manufacturing method according to claim 11 further comprising:
forming a plurality of conductive terminals on the redistribution layer before forming the conductive shield.

14. The manufacturing method according to claim 11 further comprising:
forming a photosensitive material on the wafer before forming the redistribution layer, wherein the photosensitive material comprises a central portion corresponding to the first regions of the wafer and a peripheral portion corresponding the second regions of the wafer.

15. The manufacturing method according to claim 14 further comprising:
removing the peripheral portion of the photosensitive material to form a dielectric layer after removing a portion of the wafer to form the dies, wherein the dielectric layer covers the conductive connectors on the first regions.

16. The manufacturing method according to claim 14 further comprising:
forming an encapsulant surrounding each of the dies after forming the photosensitive material, wherein the encapsulant surrounds the peripheral portion of the photosensitive material.

17. The manufacturing method according to claim 16 further comprising:
removing the peripheral portion of the photosensitive material to form a dielectric layer after forming the redistribution layer, wherein the encapsulant is spaced apart from the dielectric layer.

18. The manufacturing method according to claim 11 further comprising:

forming an encapsulant on the redistribution layer and surrounding the conductive shield before performing the singulation process.

19. The manufacturing method according to claim 11 further comprising:
    forming a plurality of contact pads on at least a part of the conductive shield before performing the singulation process, wherein the contact pads are electrically connected to the redistribution layer through the conductive shield.

20. The manufacturing method according to claim 11, wherein forming the redistribution layer comprises forming a signal-transmitting pattern and a grounding pattern, the signal-transmitting pattern is electrically connected to the conductive connectors disposed on the first regions of the wafer and the grounding pattern is electrically connected to the conductive connectors disposed on the second regions of the wafer.

* * * * *